United States Patent
Sakakibara et al.

[11] Patent Number: 5,900,391
[45] Date of Patent: * May 4, 1999

[54] HIGH TEMPERATURE SUPERCONDUCTING THIN FILM DEPOSITION METHOD

[75] Inventors: Nobuyoshi Sakakibara; Hiroki Hoshizaki; Yoshiki Ueno, all of Nisshin, Japan

[73] Assignee: Advanced Mobile Telecommunication Technology Inc., Nisshin, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/756,555

[22] Filed: Nov. 26, 1996

[30] Foreign Application Priority Data

Aug. 12, 1996 [JP] Japan ................................. 8-212226

[51] Int. Cl.⁶ ................................. C23C 14/34
[52] U.S. Cl. .................. 505/475; 505/480; 505/731; 427/62; 204/192.24
[58] Field of Search .................... 505/475, 480, 505/731; 427/62; 204/192.24

[56] References Cited

U.S. PATENT DOCUMENTS 5,270,294  12/1993  Wu et al. ........................ 505/1
5,439,877  8/1995  Face .............................. 505/475

FOREIGN PATENT DOCUMENTS

298866A2  11/1989  European Pat. Off. .
3-215304  9/1991  Japan .

OTHER PUBLICATIONS

Jia, J. Appl. Phys. 66(1), Jul. 1989, pp. 452–454.

*Primary Examiner*—Roy V. King
*Attorney, Agent, or Firm*—Lane, Aitken & McCann

[57] ABSTRACT

Herein disclosed is a method for depositing a high Tc superconducting thin film. The superconducting thin film is deposited on one surface of a substrate. The substrate is exposed to an electromagnetic wave to heat the substrate during the process for depositing the superconducting thin film. Before the processes for depositing the superconducting thin film and exposing the substrate to the electromagnetic wave, a dummy film is formed on the other surface of the substrate. The dummy film has absorbency of the electromagnetic wave which is higher than that of the substrate. The dummy film together with the substrate is exposed to the electromagnetic wave while the superconducting thin film is deposited on the one surface of the substrate. The superconducting thin film thus deposited has superconductivity and high quality crystal structure.

6 Claims, 7 Drawing Sheets

HIGH TEMPERATURE SUPERCONDUCTING THIN FILM DEPOSITION METHOD

BACKGROUND OF THE INVENTION

1. Field of the Invention

The present invention relates in general to superconducting thin film deposition method and apparatus and, more particularly, to method and apparatus for depositing a superconducting thin film on a substrate heated by radiation.

2. Description of the Related Art

In recent years, high temperature superconductors (hereinlater referred to as "HTS" for brevity) including a Y-Ba-Cu-O (hereinafter referred to as "YBCO" for brevity) system superconductor are tried to be used for microwave circuit elements or transmission lines. Since the HTS has an extremely low electric resistance at a superconductive state, the microwave circuit elements or transmission lines adopting the HTS are remarkably advantageous over those adopting normal metal conductors in reducing transmission loss of signals and in enhancing the frequency response characteristics of the microwave circuits.

As well know, a thin film is deposited through a sputtering method, a vapor deposition method, a molecular beam epitaxy method, a chemical vapor deposition method and the like. A superconducting thin film including the HTS thin film is generally deposited on a dielectric substrate such as a MgO or $LaAlO_3$ substrate through some one of the aforesaid methods. The substrate on which the superconducting thin film is to be deposited is required to be heated by a heat source during the process for depositing the superconducting thin film. The heat source is preferably spaced apart from the substrate because of the fact that the heat source causes undesired impurities to diffuse into the substrate and accordingly contaminates the substrate with the undesired impurities under the condition that the heat source is held in direct contact with the substrate during the process for depositing the superconducting thin film. The diffusion of the undesired impurities into the substrate makes poor the superconductivity of the deposited superconducting thin film. For this reason, the heat source may be designed to heat the substrate by radiation and concretely may comprise, for example, an infrared ray source which radiates the infrared rays considered to be an electromagnetic wave.

A drawback is, however, encountered in prior-art superconducting thin film deposition method above described nature in that the heat source is unable to increase the temperature of the substrate at a sufficiently high level if the substrate is a dielectric substrate such as a MgO or $LaAlO_3$ substrate through which the infrared rays penetrates relatively readily. When the temperature of the substrate is not increased to and not held at the sufficiently high level during the process for depositing the superconducting thin film, the deposited superconducting thin film is liable to be of poor crystalline quality and have a high surface resistance.

SUMMARY OF THE INVENTION

It is a primary object of the present invention to deposit a superconducting thin film of excellent superconductivity and high quality crystal structure.

In accordance with one aspect of the present invention, there is provided a superconducting thin film deposition method comprising the steps of:

(a) preparing a substrate having two surfaces diametrically opposite to each other;

(b) depositing a superconducting thin film on one of the surfaces of the substrate;

(c) exposing the substrate to an electromagnetic wave to heat the substrate during the depositing step (b); and (d) forming a dummy film on the other of the surfaces of the substrate before the depositing and exposing steps (b) and (c). The dummy film has absorbency of the electromagnetic wave which is higher than that of the substrate. During the exposing step (c), the dummy film together with the substrate is exposed to the electromagnetic wave.

In accordance with another aspect of the present invention, there is provided a superconducting thin film deposition apparatus comprising supporting means for supporting a substrate having two surfaces diametrically opposite to each other, superconducting thin film deposition means for depositing a superconducting thin film on one of the surfaces of the substrate, exposure means for exposing the substrate to an electromagnetic wave to heat the substrate while the superconducting thin film is deposited by the superconducting thin film deposition means, and dummy film formation means for forming a dummy film on the other of the surfaces of the substrate before the superconducting thin film is deposited by the superconducting thin film deposition means. The dummy film has absorbency of the electromagnetic wave which is higher than that of the substrate. The dummy film together with the substrate is exposed to the electromagnetic wave by the exposure means.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Referring to FIGS. 1 to 7 of the drawings, a preferred embodiment of the superconducting thin film deposition method and apparatus according to the present invention will be described hereinafter. In the present embodiment, a product manufactured by the superconducting thin film deposition apparatus is used as a microwave circuit or transmission line construction. The microwave circuit comprises a strip conductor, a ground conductor, and a dielectric substrate sandwiched between the strip conductor and the ground conductor and having a low dielectric loss. As will be apparent from the following description, the strip conductor and the ground conductor are constituted by superconducting thin films and, for this reason, the performance of the microwave circuit is enhanced all the more. In the present embodiment, the superconducting thin film deposition apparatus is designed to perform film deposition processes through sputtering techniques.

Figure 1:
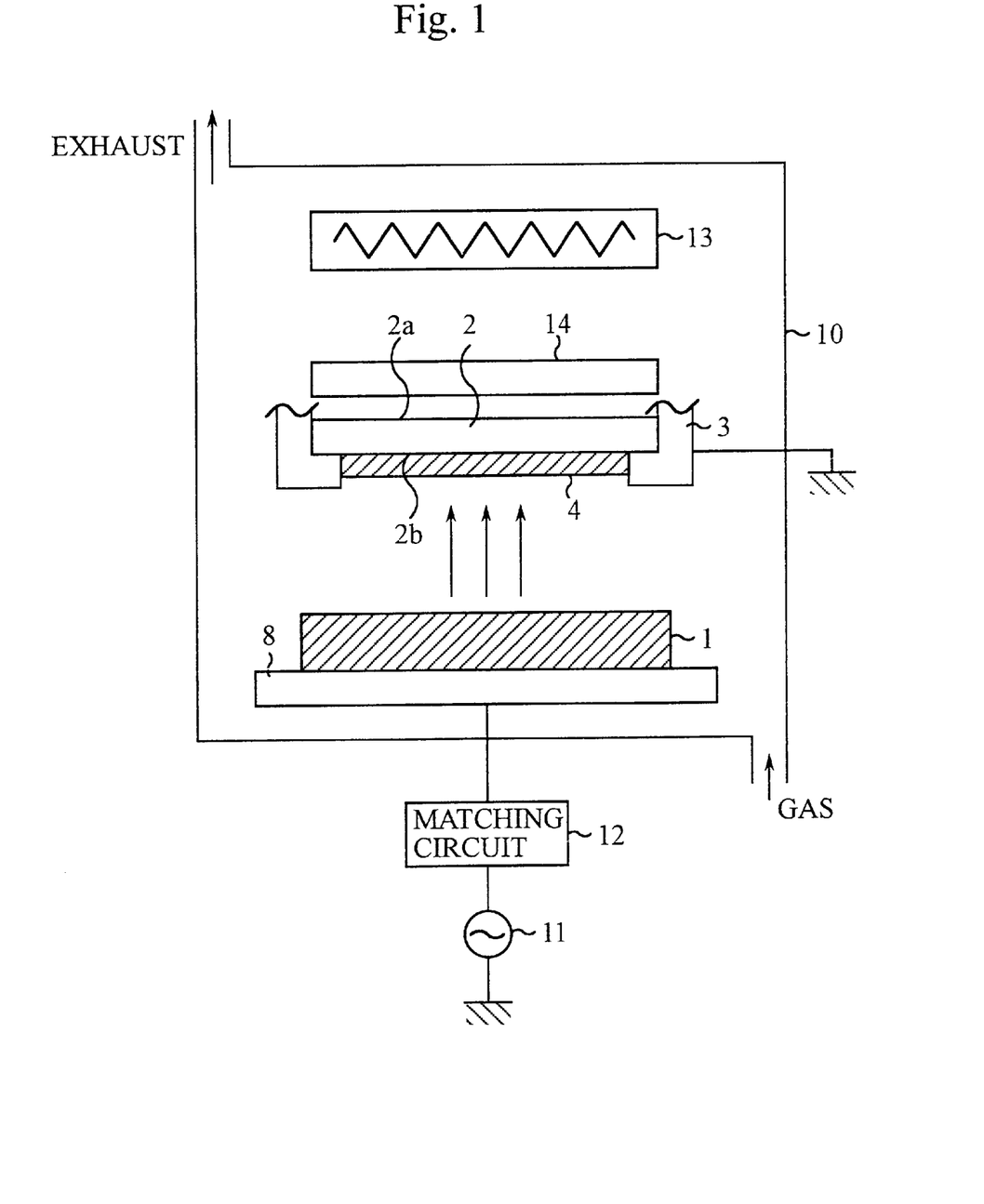
FIG. 1 is a schematic view showing a preferred embodiment of a superconducting thin film deposition apparatus acceding to the present invention and showing one way of practicing a dummy film forming step included in a superconducting thin film deposition method according to the present invention.

In FIG. 1, there are provided a sputtering target denoted by reference numeral 1 and a dielectric substrate denoted by reference numeral 2. The sputtering target 1 and the dielectric substrate 2 are housed in a vacuum chamber 10 that is initially pumped down to an extremely low pressure, for instance, lower than $10^{-5}$ Torr. The vacuum chamber 10 then is back-filled with a certain gas such as an Ar or Ar+O gas to $10^{-2}$ Torr. The sputtering target 1 is, for example, a YBCO target and placed on a support plate 8 serving as a cathode electrically connected to a radio frequency (hereinlater for brevity referred to as "RF") power source 11 through a matching circuit 12. The dielectric substrate 2 is made of, for example, MgO or LaAlO$_3$ and held by a substrate holder 3 which is grounded. The dielectric substrate 2 has a first surface 2a and a second surface 2b diametrically opposite to each other. The first surface 2a of the dielectric substrate 2 is shown in FIG. 1 as being an upper side surface, while the second surface 2b of the dielectric substrate 2 is shown in FIG. 1 as being a lower side surface. The sputtering target 1 is placed under the dielectric substrate 2 and, accordingly, in opposition to the second surface 2b of the dielectric substrate 2. The vacuum chamber 10 houses a radiant heat source 13 which is designed to radiate electromagnetic waves such as infrared rays which have wave lengths lying in a relatively narrow range extend from 2.5 μm. The radiant heat source 13 is placed above the dielectric substrate 2 and, accordingly, in opposition to the first surface 2a of the dielectric substrate 2. The vacuum chamber 10 further houses a cover plate member 14 placed between the dielectric substrate 2 and the radiant heat source 13 and spaced apart from the dielectric substrate 2 at a distance, for example, from 1 mm to 2 mm. The cover plate member 14 merely serves to prevent undesired impurities ejected from the radiant heat source 13 from contaminating the dielectric substrate 2 and the following superconducting thin film 5, and scarcely serves to prevent the electromagnetic waves from the radiant heat source 13 from reaching the dielectric substrate 2. Similarly to the dielectric substrate 2, the cover plate member 14 is made of, for example, MgO or LaAlO$_3$.

When the RF power source 11 is operated to apply an RF voltage to the sputtering target 1 though the matching circuit 12, a plasma is formed between the sputtering target 1 and the dielectric substrate 2. At this time, the resulting ions arising in the gas plasma impact the sputtering target 1 and, for this reason, atoms are ejected from the sputtering target 1 and deposited on the second surface 2b of the dielectric substrate 2. The atoms deposited through the sputtering method form a thin film denoted by reference numeral "4" in FIG. 1. The thin film 4 corresponds to a dummy film which is merely used to heat the dielectric substrate 2 during a process for depositing the objective superconducting thin film. The thin film 4, therefore, has no need to have superconductivity of high quality. That is, the radiant heat source 13 is permitted not to heat the dielectric substrate 2 during the process for depositing the thin film 4. In addition, there is no need for the cover plate member 14 to intervene between the dielectric substrate 2 and the radiant heat source 13 when the dielectric substrate 2 is not heated by the radiant heat source 13.

Figure 2:
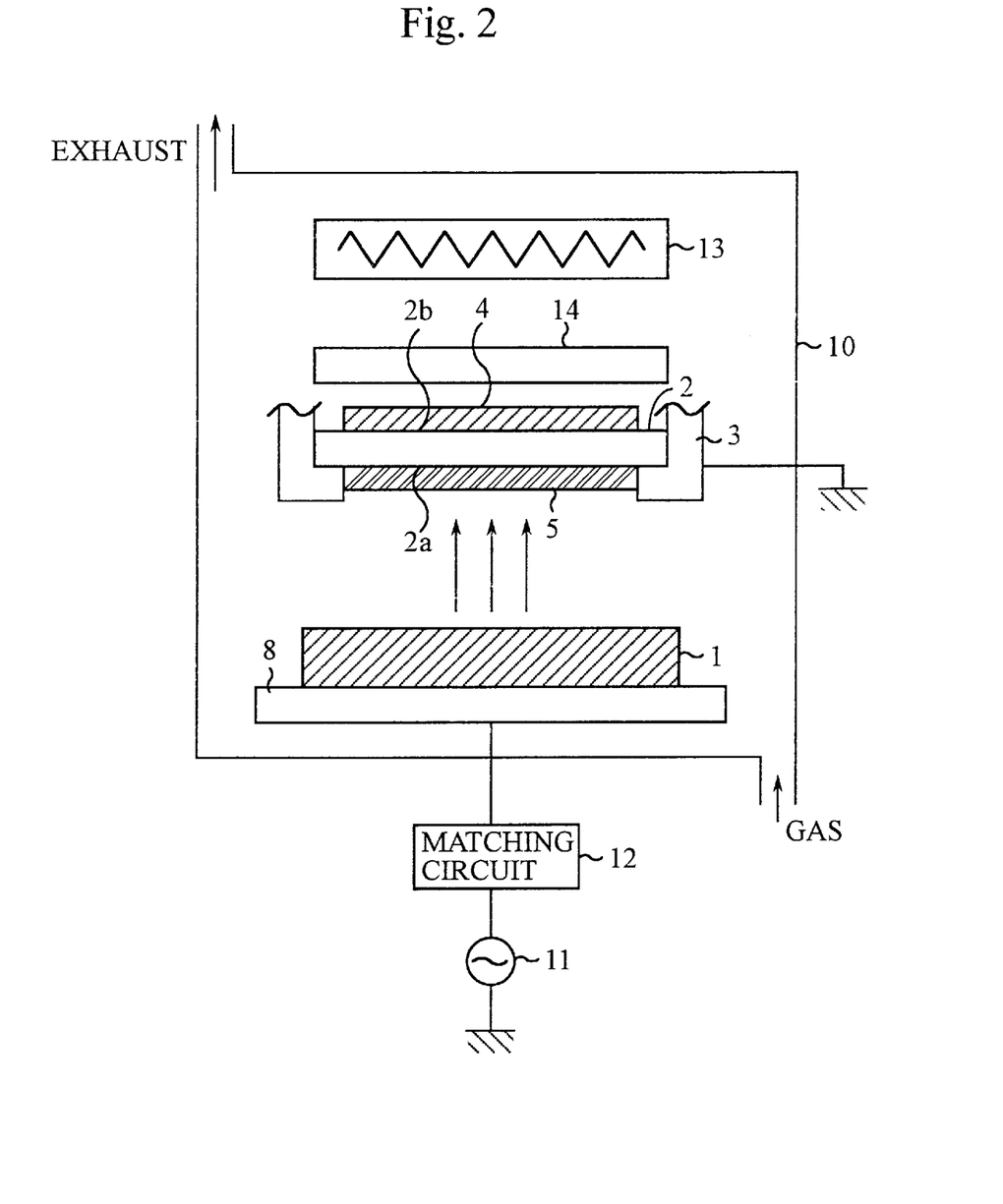
FIG. 2 is a schematic view showing one way of practicing a superconducting thin film depositing step included in the superconducting thin film deposition method according to the present invention.
Figure 6:
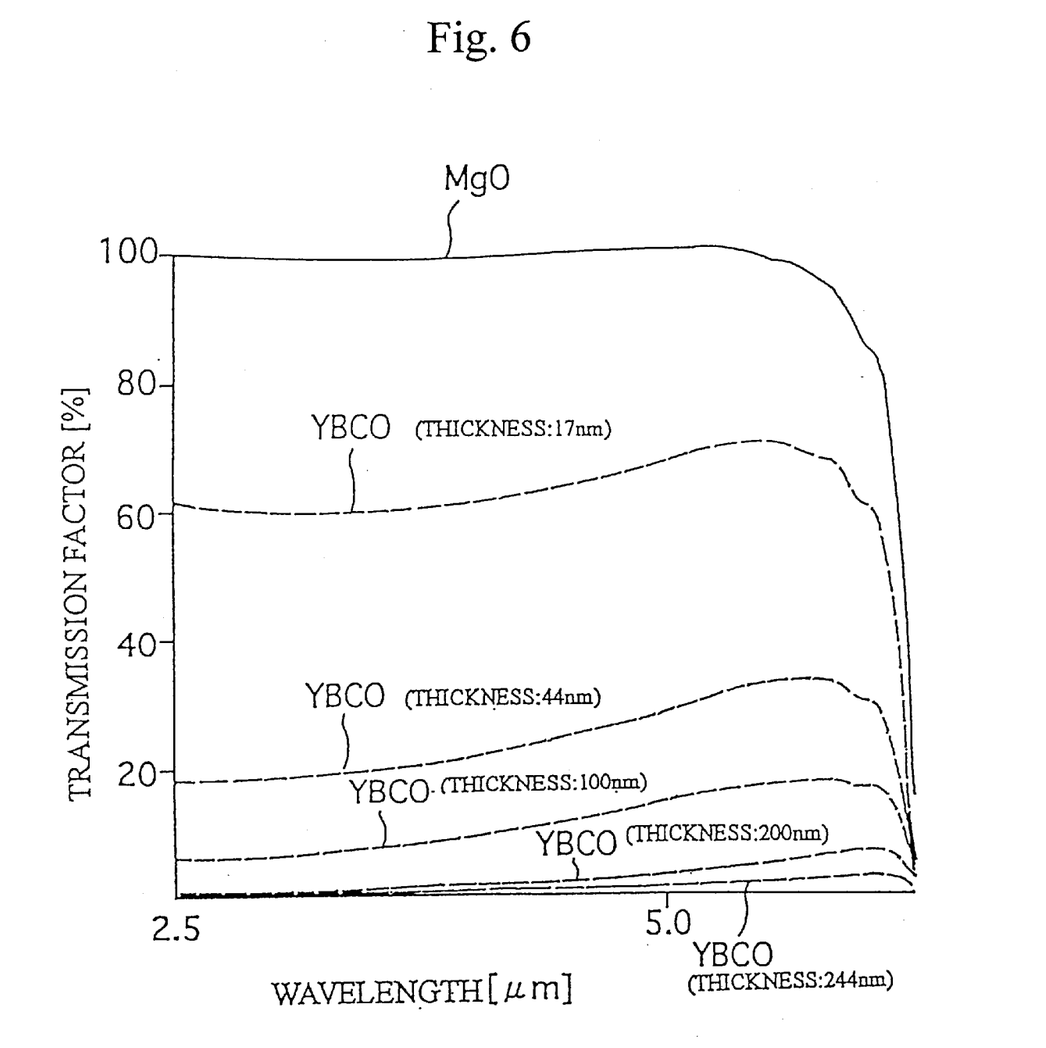
FIG. 6 is a graph showing wavelength-transmission characteristics of a MgO substrate and YBCO thin films deposited on the MgO substrate and having different thicknesses.
Figure 7:
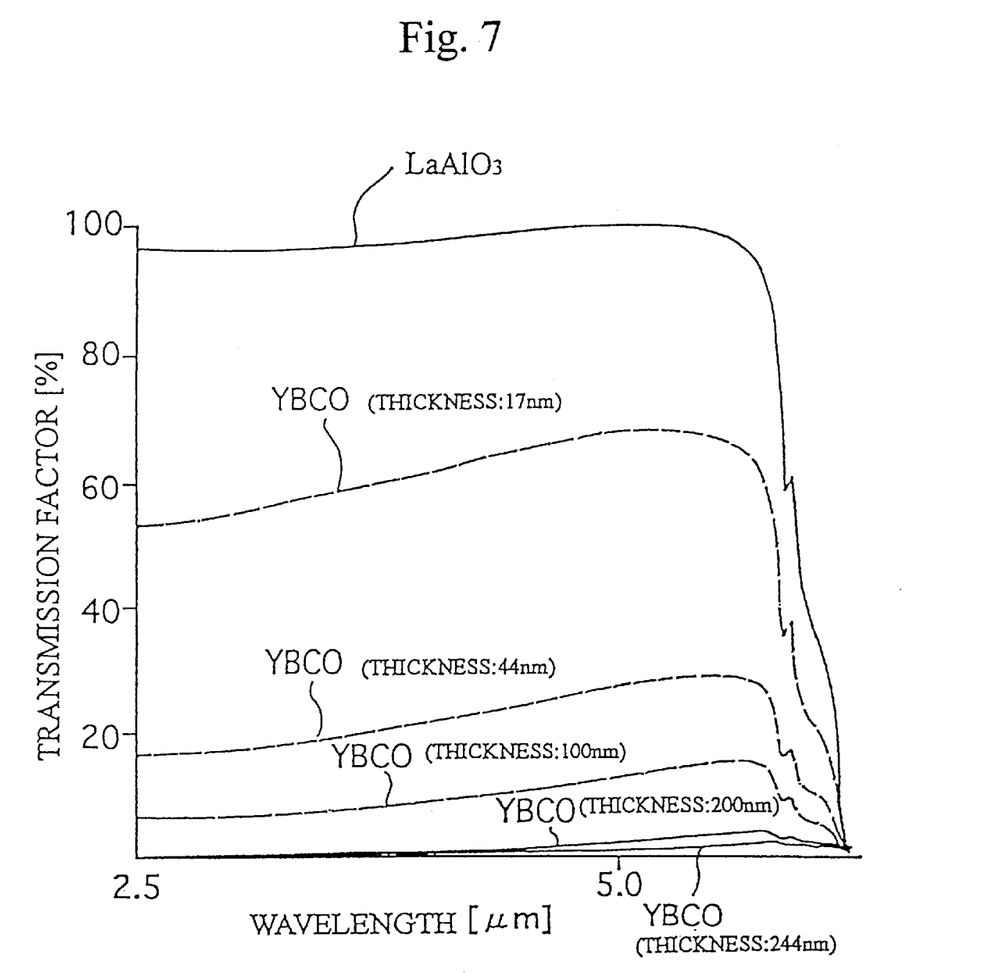
FIG. 7 is a graph showing wavelength-transmission characteristics of a $LaAlO_3$ substrate and YBCO thin films deposited on the $LaAlO_3$ substrate and having different thickness.

After the thin film 4 is thus deposited on the second surface 2b of the dielectric substrate 2, the dielectric substrate 2 is turned upside down by turning means (not shown) as shown in FIG. 2. As a consequence, the first surface 2a of the dielectric substrate 2 faces the sputtering target 1, while the second surface 2b having the thin film 4 deposited thereon faces the radiant heat source 13. The superconducting thin film deposition apparatus then is operated to deposit a superconducting thin film 5 on the first surface 2a of the dielectric substrate 2. In the sputter deposition process shown in FIG. 2, the radiant heat source 13 is turned on and held at the "ON" state while the superconducting thin film 5 is deposited on the first surface 2a of the dielectric substrate 2. This means that the thin film 4 is exposed to the infrared rays radiated from the radiant heat source 13 during the process for depositing the superconducting thin film 5. FIG. 6 shows wavelength-transmission characteristics of a MgO substrate and YBCO thin films deposited on the MgO substrate and having different thicknesses. As will be understood from the wavelength-transmission characteristics shown in FIG. 6, the thin film 4 made of YBCO has absorbency of the infrared rays higher than that of the dielectric substrate 2 made of MgO. For this reason, the thin film 4 is efficiently and uniformly heated by the infrared rays radiated from the radiant heat source 13 through the cover plate member 14, so that the dielectric substrate 2 of MgO can be sufficiently heated by virtue of the heat conduction from the thin film 4 through an interface between the thin film 4 and the dielectric substrate 2. If there is formed no thin film of YBCO on the second surface 2b of the dielectric substrate 2 of MgO, the dielectric substrate 2 is exposed to but scarcely heated by the infrared rays radiated from the radiant heat source 13. The reason why the dielectric substrate 2 of MgO is scarcely heated is that the almost infrared rays of 2.5 μm penetrate through the dielectric substrate of MgO without absorption as will be apparent from the wavelength-transmission characteristic of the MgO substrate shown in FIG. 6. The wavelength-transmission characteristic of the MgO substrate is similar to that of a LaAlO$_3$ substrate. FIG. 7 shows wavelength-transmission characteristics of the LaAlO$_3$ substrate and YBCO thin films formed on the LaAlO$_3$ substrate and having different thicknesses. If the dielectric substrate 2 is made of LaAlO$_3$, the dielectric substrate 2 of LaAlO$_3$ can be sufficiently heated by virtue of the heat conduction from the thin film 4 through the interface between the thin film 4 and the dielectric substrate 2.

As will be appreciated from the foregoing sputter deposition method, the dielectric substrate 2 is heated without being brought into contact with a heat source while the superconducting thin film 5 is deposited on the first surface 2a of the dielectric substrate 2. If, furthermore, atoms are ejected from the radiant heat source 13 due to high temperature, the ejected atoms is intercepted by the cover plate member 14. Hence, undesired impurities from heat source are prevented from diffusing into the dielectric substrate 2 during the process for depositing the superconducting thin film 5. In addition, the dielectric substrate 2 is sufficiently heated, during the process for depositing the superconducting thin film 5, by virtue of the head conduction from the previously formed thin film 4 having the absorbency of the infrared rays which is higher than that of the dielectric substrate 2. The superconducting thin film 5 thus deposited has the most suitable composition and crystalline structure and, accordingly, becomes a superconductor of high quality. Furthermore, the thin film 4 as a dummy film is formed by utilizing the sputtering apparatus and the sputtering target which are to be used to form the originally objective superconducting thin film 5, so that the process for forming the thin film 4 can become simple and effortless.

Figure 3A:
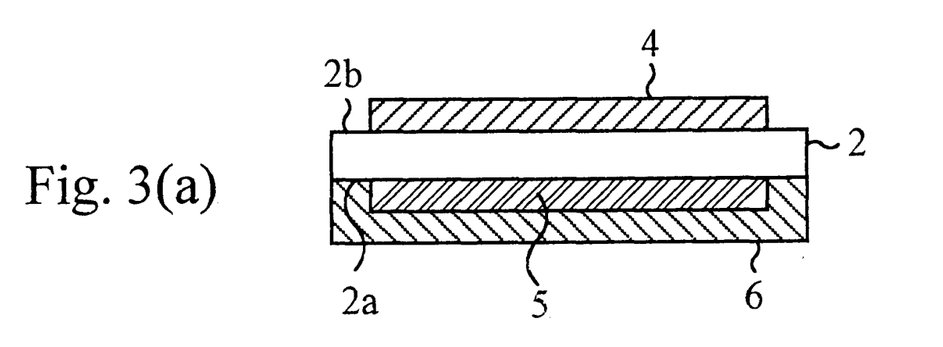
FIGS. 3(a) to 3(c) are schematic views as a whole showing one way of practicing a dummy film removing step included in the superconducting thin film deposition method according to the present invention.
Figure 3B:
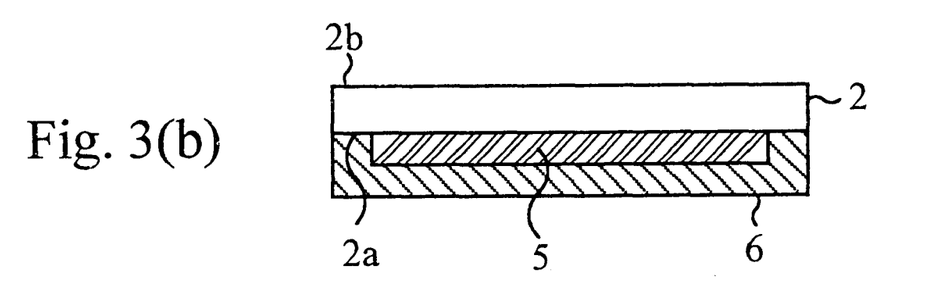
Figure 3C:
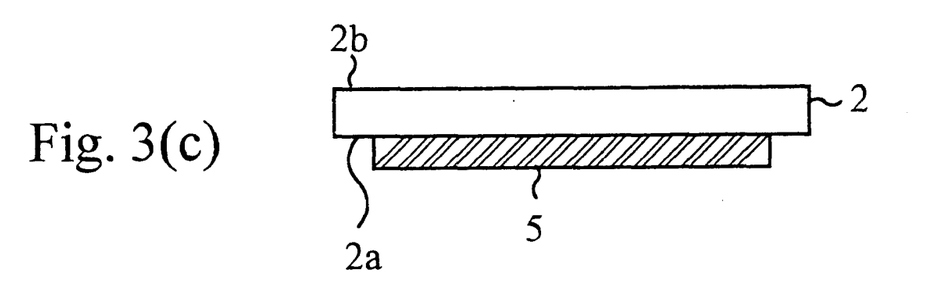

After the superconducting thin film 5 is deposited on the first surface 2a of the dielectric substrate 2, the dielectric substrate 2 is got out of the vacuum chamber 10 in order to remove the thin film 4 formed as a dummy film from the dielectric substrate 2 through the processes shown in FIGS. 3(a) to 3(c). Specifically, as shown in FIG. 3(a), a resist film 6 is formed as covering the superconducting thin film 5 and the partially revealed first surface 2a of the dielectric substrate 2. Through a suitable etching process, the thin film 4 is removed from the dielectric substrate 2 as shown in FIG. 3(b). The resist film 6 then is removed from the dielectric substrate 2 as shown in. FIG. 3(c).

The dielectric substrate 2 with only the superconducting thin film 5 is replaced in the vacuum chamber 10 so as to have the second surface 2b directed toward the sputtering target 1. The superconducting thin film deposition apparatus then is operated to deposit an additional superconducting thin film 7 on the second surface 2b of the dielectric substrate 2. In the sputtering process shown in FIG. 4, the radiant heat source 13 is turned on and held at the "ON" state while the additional superconducting thin film 7 is deposited on the second surface 2b of the dielectric substrate 2. This results in the fact that the superconducting thin film 5 is exposed to the infrared rays radiated from the radiant heat source 13 through the cover plate member 14 during the process for depositing the superconducting thin film 7. By the infrared rays from the radiant heat source 13, the superconducting thin film 5 is efficiently and uniformly heated and, as a consequence, the dielectric substrate 2 is sufficiently heated by virtue of the heat conduction from the superconducting thin film 5 through an interface between the superconducting thin film 5 and the dielectric substrate 2. Therefore, similarly to the superconducting thin film 5, the additional superconducting thin film 7 has the most suitable composition and crystalline structure and, accordingly, becomes a superconductor of high quality.

Figure 4:
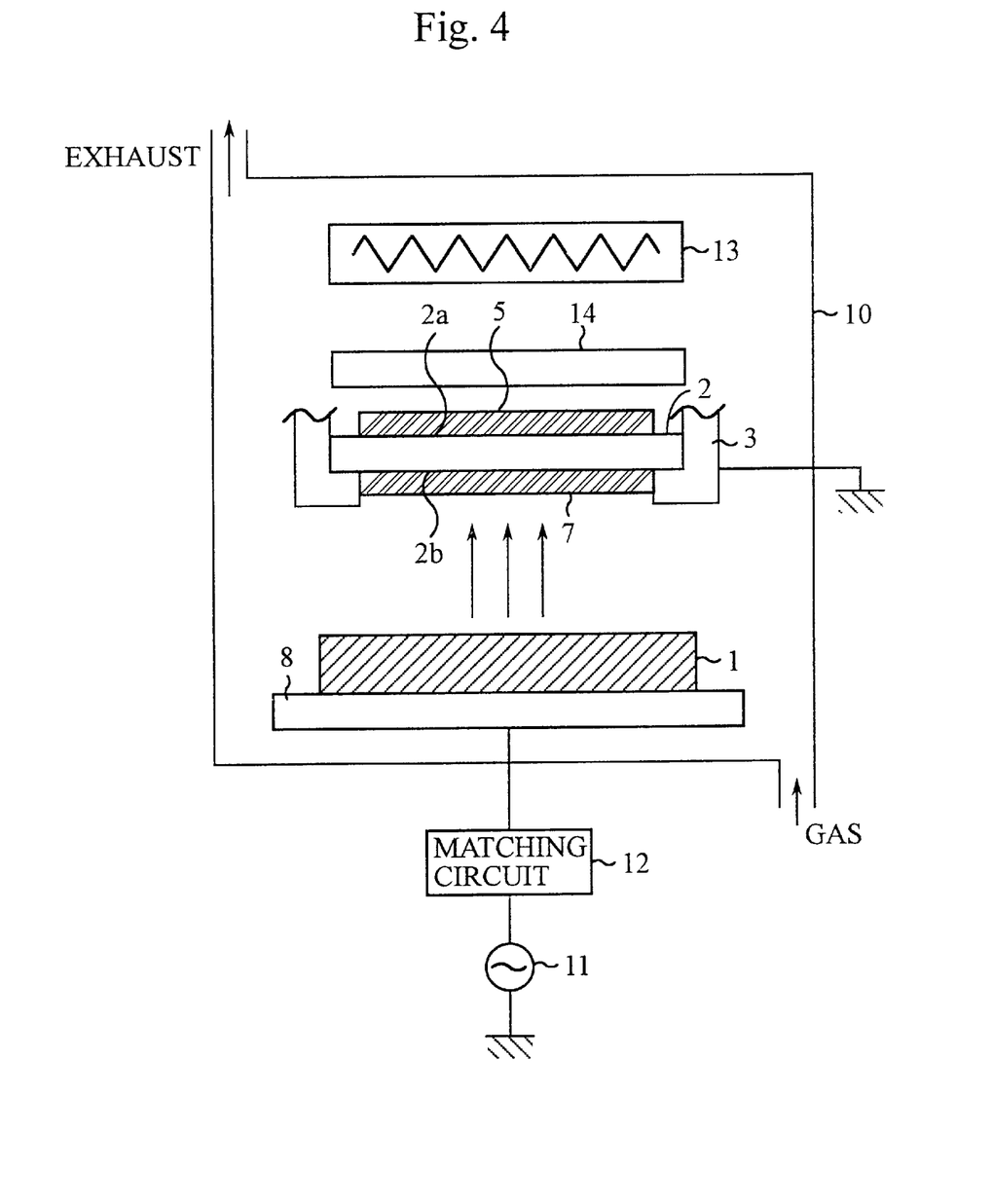
FIG. 4 is a schematic view showing one way of practicing an additional superconducting thin film deposition step included in the superconducting thin film deposition method according to the present invention.
Figure 5:
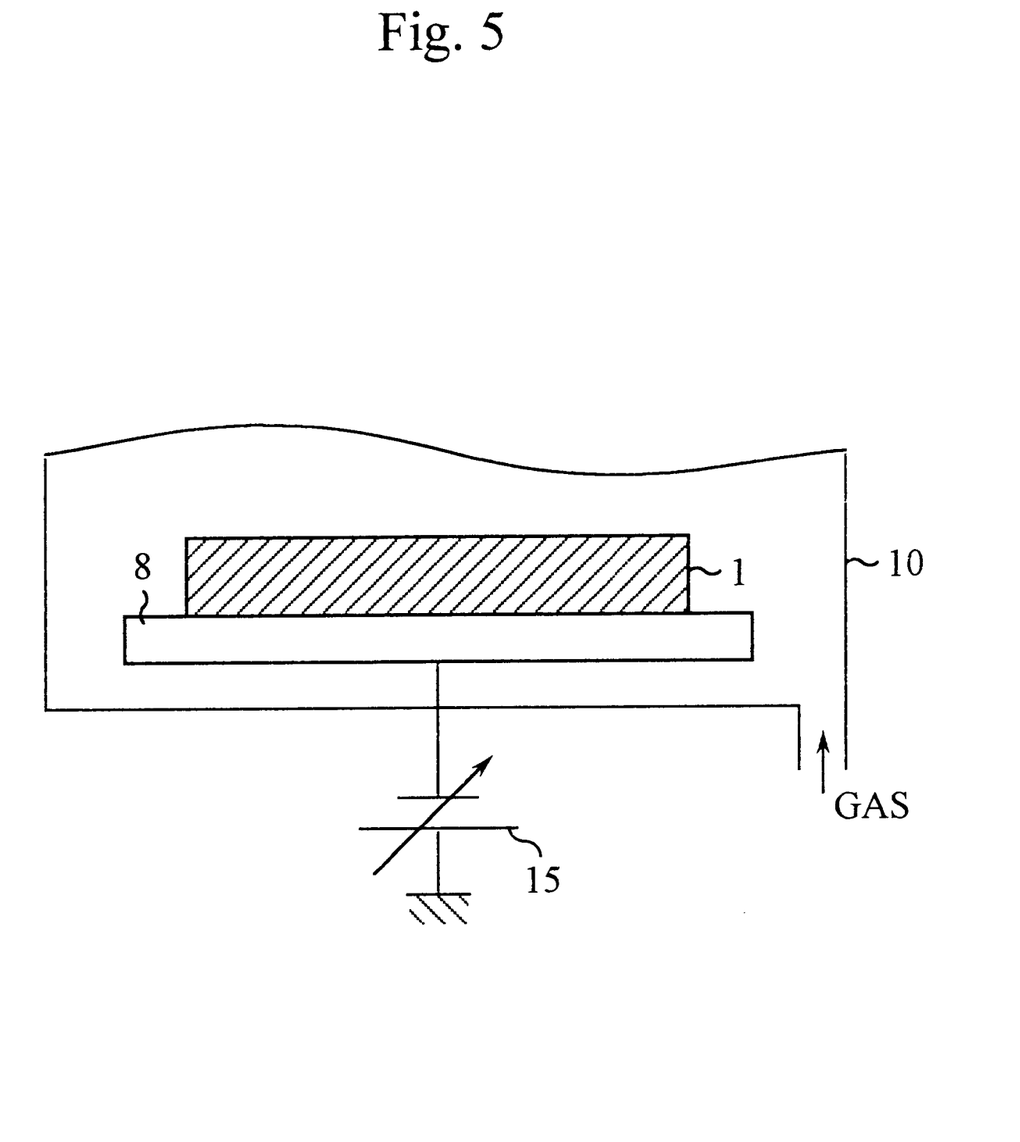
FIG. 5 is a schematic view showing a direct current power source substitutable for a radio frequency power source and a matching circuit shown in FIGS. 1, 2 and 4.

The RF power source 11 and the matching circuit 12 shown in FIGS. 1, 2 and 4 may be replaced with a direct current power source (hereinlater referred to as "DC power source") 15 shown in FIG. 5. When the RF power source 11 is adopted as a power source, the sputtering target 1 may be an insulator or a conductor. When the DC power source 15 is adopted as a power source, the sputtering target 1 is required to be a conductor. The adoption of the DC power source 15 causes the rate of film deposition to decrease in comparison with that of the RF power source 11.

Although the thin film 4 as a dummy film is formed on the second surface 2b of the dielectric substrate 2, by way of example, through the sputtering method, the thin film 4 may be formed by sticking a previously formed film on the second surface 2b of the dielectric substrate 2 with an adhesive. The sticking method is, however, inappropriate to manufacture a product such as a circuit of strip line construction comprising a substrate and two superconducting thin films respectively deposited on surfaces of the substrate. The reason is that the adhesive serving as a hindrance to the deposition of the additional superconducting thin film 7 is difficult to be entirely removed from and accordingly apt to remain on the second surface 2b of the dielectric substrate 2 when the thin film 4 is removed from the second surface 2b of the dielectric substrate 2.

In addition, the thin film 4 as a dummy film may be formed on the second surface 2b of the dielectric substrate 2 through screen process printing techniques, or by spreading or spraying a superconducting liquid material on the second surface 2b of the dielectric substrate 2.

The many features and advantages of the invention are apparent from the detailed specification and thus it is intended by the appended claims to cover all such features and advantages of the invention which fall within the true spirit and scope thereof Further, since numerous modifications and changes will readily occur to those skilled in the art, it is not desired to limit the invention to the exact construction and operation illustrated and described, and accordingly, all suitable modifications and equivalents may be resorted to, falling with the scope of the invention.

What is claimed is:

1. A high temperature superconducting thin film deposition method comprising the steps of:

(a) preparing a substrate having two surfaces diametrically opposite each other;

(b) depositing a high temperature superconducting thin film on one of the surfaces of said substrate;

(c) exposing said substrate to an electromagnetic wave to heat said substrate during said depositing step (b) said superconducting thin film having absorbency of said electromagnetic wave which is higher than that of said substrate;

(d) forming a dummy film on the other of the surfaces of said substrate before said depositing and exposing steps (b) and (c), said dummy film having absorbency of said electromagnetic wave which is higher than that of said substrate, and being exposed together with said substrate to said electromagnetic wave during said exposing step (c);

(e) covering said superconducting thin film with a resist;

(f) removing said dummy film from said substrate after said covering step (e);

(g) removing said resist from said substrate;

(h) depositing an additional high temperature superconducting thin film on said one of the surfaces of said substrate after said removing step (e); and (i) exposing said superconducting thin film on said one of the surfaces of said substrate to said electromagnetic wave to heat said substrate during the depositing step (h), said superconducting thin film on said one of the surfaces of said substrate, in said exposing step (i), being exposed to said electromagnetic wave through a cover plate member which prevents said superconducting thin film on said one of the surfaces of said substrate from being contaminated with impurities, and said cover plate member being spaced apart from said superconducting thin film at a predetermined distance.

2. A high temperature superconducting thin film deposition method as set forth in claim 1, in which said forming step (d) comprises steps of:

(d1) preparing source materials for said dummy film; and (d2) depositing said source materials on said other of the surfaces of said substrate to form said dummy film.

3. A high temperature superconducting thin film deposition method as set forth in claim 2, in which said depositing step (b) comprises the step (b1) of depositing said source materials on said one of the surfaces of said substrate to deposit said superconducting thin film.

4. A high temperature superconducting thin film deposition method as set forth in claim 3, in which said source materials prepared in said preparing step (d1) form a sputtering target, said depositing steps (b1) and (d2) being performed through a sputtering method.

5. A high temperature superconducting thin film deposition method as set forth in claim 1, in which said forming step (d) comprises the steps of:

(d1) preparing a film having absorbency of said electromagnetic wave which is higher than that of said substrate; and (d2) sticking said film on said other of the surfaces of said substrate to form said dummy film.

6. A high temperature superconducting thin film deposition method as set forth in claim 1, in which said dummy film is a high temperature superconducting thin film.

* * * * *